(12) United States Patent
Ueno et al.

(10) Patent No.: US 9,274,182 B2
(45) Date of Patent: Mar. 1, 2016

(54) MAGNETIC FIELD MEASUREMENT APPARATUS

(75) Inventors: Hitoshi Ueno, Chofu (JP); Kimio Nagasaka, Hokuto (JP)

(73) Assignee: Seiko Epson Corporation (JP)

( * ) Notice: Subject to any disclaimer, the term of this patent is extended or adjusted under 35 U.S.C. 154(b) by 90 days.

(21) Appl. No.: 13/614,610

(22) Filed: Sep. 13, 2012

(65) Prior Publication Data

US 2013/0093421 A1 Apr. 18, 2013

(30) Foreign Application Priority Data

Oct. 18, 2011 (JP) ................................. 2011-229036

(51) Int. Cl.
*G01R 33/00* (2006.01)
*G01R 33/032* (2006.01)

(52) U.S. Cl.
CPC .......... *G01R 33/0327* (2013.01); *G01R 33/032* (2013.01)

(58) Field of Classification Search
CPC .. G01R 33/032; G01R 33/0327; G01R 33/02; G01R 33/022; G01R 33/26; G01R 33/0286; G01R 33/0385; G01R 33/20; G01R 33/24; G01C 19/60; G01C 19/62
USPC ........................ 324/260, 318, 304, 301, 244.1
See application file for complete search history.

(56) References Cited

U.S. PATENT DOCUMENTS

| | | | | | |
|---|---|---|---|---|---|
| 5,189,368 | A | * | 2/1993 | Chase | G01R 33/032 102/417 |
| 5,357,199 | A | * | 10/1994 | Leger et al. | 324/301 |
| 5,534,776 | A | * | 7/1996 | Leger et al. | 324/304 |
| 7,282,910 | B1 | * | 10/2007 | Kanegsberg | 324/304 |
| 7,656,154 | B2 | * | 2/2010 | Kawabata et al. | 324/244.1 |
| 7,826,065 | B1 | * | 11/2010 | Okandan | G01B 11/02 324/244.1 |
| 8,054,074 | B2 | * | 11/2011 | Ichihara et al. | 324/304 |
| 8,405,389 | B2 | * | 3/2013 | Sugioka et al. | 324/244.1 |
| 2004/0140799 | A1 | * | 7/2004 | Romalis et al. | 324/301 |
| 2010/0090697 | A1 | * | 4/2010 | Savukov | G01R 33/26 324/309 |
| 2010/0244970 | A1 | * | 9/2010 | Le Prado et al. | 331/94.1 |
| 2010/0327861 | A1 | * | 12/2010 | Nagasaka | 324/244.1 |
| 2010/0327862 | A1 | * | 12/2010 | Nagasaka | 324/244.1 |
| 2010/0327865 | A1 | * | 12/2010 | Nagasaka | 324/301 |
| 2011/0025323 | A1 | * | 2/2011 | Budker et al. | 324/304 |
| 2011/0025330 | A1 | * | 2/2011 | Bulatowicz et al. | 324/318 |
| 2011/0031969 | A1 | * | 2/2011 | Kitching et al. | 324/304 |

FOREIGN PATENT DOCUMENTS

| | | |
|---|---|---|
| JP | 2009-236599 | 10/2009 |
| JP | 2010-085134 A | 4/2010 |

* cited by examiner

*Primary Examiner* — Tung X Nguyen
*Assistant Examiner* — David Frederiksen
(74) *Attorney, Agent, or Firm* — Harness, Dickey & Pierce, P.L.C.

(57) ABSTRACT

A magnetic field measurement apparatus includes an irradiation portion, a gas cell, a measurement unit (polarization separation unit, light receiving portion, signal processing circuit), and a magnetic shield. The magnetic shield is formed in a elongated hollow shape having openings at both sides thereof. The gas cell, in which gaseous atoms are sealed, is disposed in a hollow area of the magnetic shield. The irradiation portion irradiates irradiation light including linearly polarized light adjusted so that the vibration direction of an electric field coincides with the axis direction of the magnetic shield onto the gaseous atoms sealed in the gas cell along a direction perpendicular to the axis of the magnetic shield. The measurement unit measures a rotational angle of a polarization plane of the irradiation light that has been irradiated by the irradiation portion and passed through the gaseous atoms.

6 Claims, 9 Drawing Sheets

MAGNETIC FIELD MEASUREMENT APPARATUS

BACKGROUND

1. Technical Field

The present invention relates to magnetic field measurement apparatuses making use of light.

2. Related Art

Magnetic field measurement apparatuses making use of light are apparatuses that measure minute magnetic fields generated from biological objects, such as a magnetic field from the heart (magneto-cardiogram) and a magnetic field from the brain (magneto-encephalogram), and are expected to be applied in medical image diagnostic apparatuses and the like. An element in which a gas of alkali metal atom or the like is sealed is used in measuring a magnetic field. By irradiating pump light on the element mentioned above, energy of the atom in the element is excited in accordance with the magnetic field and a polarization plane of probe light having passed through the element is rotated due to a magneto-optic effect. A magnetic field measurement apparatus measures a rotational angle of the polarization plane as magnetic field information.

Researches to enhance the sensitivity of the magnetic field measurement apparatus have been carried out. A light pumping magnetometer that makes it possible to detect a magnetic field at a higher level of sensitivity by increasing the intensity of a detection signal is disclosed in JP-A-2009-236599.

However, the magnetometer disclosed in JPA-2009-236599 has a problem in that its sensitivity is lowered if there exists a magnetic field disturbance in a direction other than the direction of a magnetic field to be measured.

SUMMARY

An advantage of some aspects of the invention is to measure a magnetic field while suppressing the influence of a magnetic field disturbance that exits in a direction other than the direction of the magnetic field to be measured.

In order to solve the above problem, a magnetic field measurement apparatus according to an aspect of the invention includes: a magnetic shield that is formed in a elongated hollow shape having openings at both sides thereof; a gas cell in which gaseous atoms are sealed and that is disposed in a hollow area of the magnetic shield; an irradiation unit that irradiates irradiation light including linearly polarized light adjusted so that the vibration direction of an electric field coincides with the axis direction of the magnetic shield onto the gaseous atoms sealed in the gas cell along a direction perpendicular to the axis of the magnetic shield; and a measurement unit that measures a rotational angle of a polarization plane of the irradiation light which has been irradiated by the irradiation unit and passed through the gaseous atoms.

With the configuration described above, a magnetic field can be measured while suppressing the influence of a magnetic field disturbance that is present in a direction other than the direction of the magnetic field to be measured.

It is preferable for the irradiation unit to guide the irradiation light to the gas cell with an optical fiber.

With the above configuration, limitations on size, arrangement and so on of the irradiation unit can be reduced in comparison with a case in which the irradiation light is guided to the gas cell without using an optical fiber.

A magnetic field measurement apparatus according to another aspect of the invention includes: a magnetic shield that is formed in a elongated hollow shape having openings at both sides thereof; a gas cell in which gaseous atoms are sealed and that is disposed in a hollow area of the magnetic shield; a pump light irradiation unit that irradiates pump light including a circularly polarized light component onto the gaseous atoms sealed in the gas cell along a direction parallel to the axis of the magnetic shield; a probe light irradiation unit that irradiates probe light including linearly polarized light onto the gaseous atoms sealed in the gas cell along a direction perpendicular to the axis of the magnetic shield; and a measurement unit that measures a rotational angle of a polarization plane of the probe light which has been irradiated by the probe light irradiation unit and passed through the gaseous atoms.

With the configuration described above, a magnetic field can be measured while suppressing the influence of a magnetic field disturbance that is present in a direction other than the direction of the magnetic field to be measured.

It is preferable for the pump light irradiation unit to guide the pump light to the gas cell with an optical fiber and for the probe light irradiation unit to guide the probe light to the gas cell with an optical fiber.

With the above configuration, limitations on size, arrangement and so on of the pump light irradiation unit and the probe light irradiation unit can be reduced in comparison with a case in which the pump light and the probe light are not guided to the gas cell with optical fibers.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. First Embodiment 1-1. Configuration

Figure 1:
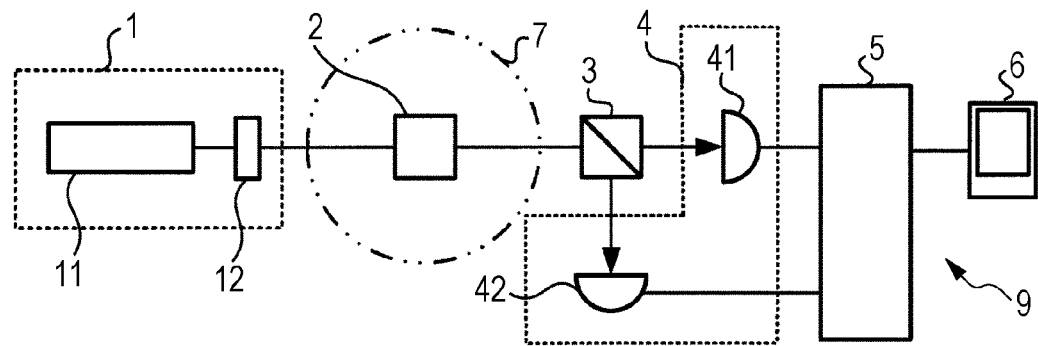
FIG. 1 is a diagram illustrating an overall configuration of a magnetic field measurement apparatus according to a first embodiment of the invention.

FIG. 1 is a diagram illustrating an overall configuration of a magnetic field measurement apparatus 9 according to a first embodiment of the invention. The magnetic field measurement apparatus 9 is what is known as a one-beam type measurement apparatus in which irradiated probe light serves as both probe light itself and pump light. An irradiation portion 1 includes a light source 11 and a converter 12. The light source 11 is a laser generation device that generates a laser of a frequency that corresponds to a hyperfine structure level transition of the atom sealed in a gas cell 2 explained later. The converter 12 includes a polarization plate and the like and converts the laser generated by the light source 11 to irradiation light including a linearly polarized light component in a predetermine direction. The irradiation light having been generated by the light source 11 and converted by the converter 12 is guided by an optical fiber or the like, for example, and irradiated to the gas cell 2. The irradiation light may be irradiated directly from an irradiation unit or the like without using an optical fiber or the like by disposing the irradiation portion 1 inside a magnetic shield 7 explained later, for example. However, limitations on size, arrangement and so on of the irradiation portion 1 are reduced by guiding the irradiation light using an optical fiber or the like.

The gas cell 2 is a cell (element) made of glass in which atoms of alkali metal such as potassium (K), cesium (Cs) or the like are sealed. The gas cell 2 transmits the above described irradiation light irradiated from the irradiation portion 1 therethrough. The irradiation light having passed through the gas cell 2 is guided to a polarization separation unit 3 with an optical fiber or the like. Here, the material of the gas cell 2 is not limited to glass, and a material such as a resin or the like may be employed as long as the material transmits irradiation light. Note that the irradiation light having passed through the gas cell 2 may be irradiated directly from an irradiation unit or the like without using an optical fiber.

The polarization separation unit 3 separates the irradiation light having passed through the gas cell 2 in accordance with a polarization direction. Specifically, the polarization separation unit 3 transmits a linearly polarized light component arranged in the same direction as the linearly polarized light component included in the irradiation light before being converted by the converter 12, and reflects light having a polarized light component in a direction perpendicular to the polarization direction of the above linearly polarized light component.

A light receiving portion 4 includes a transmission light receiving element 41 and a reflection light receiving element 42. The transmission light having passed through the polarization separation unit 3 is received by the transmission light receiving element 41, while the reflection light having reflected off the polarization separation unit 3 is received by the reflection light receiving element 42. The transmission light receiving element 41 and the reflection light receiving element 42 respectively generate a signal in accordance with the received light quantity and supply the generated signal to a signal processing circuit 5. The signal processing circuit 5 receives the above signal from each of the transmission light receiving element 41 and the reflection light receiving element 42. Then, based on the received each signal, the signal processing circuit 5 measures an amount of rotation of the linearly polarized light component included in the irradiation light that has been irradiated by the irradiation portion 1, i.e., measures a rotational angle of a polarization plane thereof; the rotation is made while the linearly polarized light component passing through the gas cell 2. The polarization separation unit 3, the light receiving portion 4, and the signal processing circuit 5 function as a measurement unit that measures a rotational angle of the polarization plane of the irradiation light having been irradiated by the irradiation portion 1 and passed through the gaseous atoms. A display unit 6 displays the rotational angle of the polarization plane measured by the signal processing circuit 5.

The magnetic shield 7 indicated in a dot-dot-dash line in FIG. 1 is a shield formed in a elongated hollow shape having openings at both ends thereof and suppresses a magnetic field of an exterior area from penetrating into a hollow area of the shield. It is to be noted that the position of the magnetic shield 7 illustrated in FIG. 1 does not represent the actual position of arrangement with respect to the irradiation portion 1, the gas cell 2 and the polarization separation unit 3.

Figure 2:
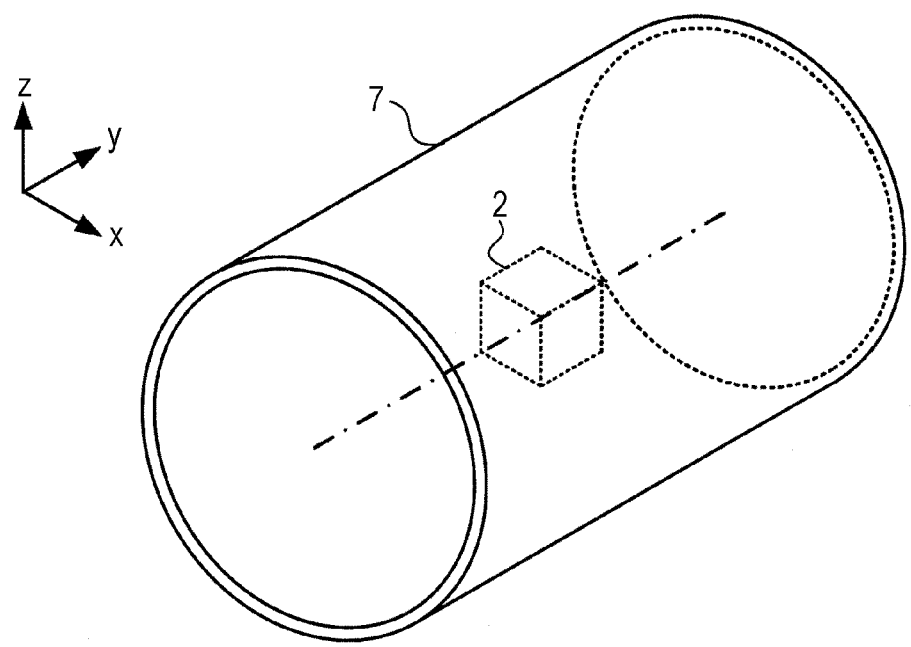
FIG. 2 is a diagram illustrating an exterior appearance of a magnetic shield.

The material of the magnetic shield 7 contains magnetized materials made of permalloy, amorphous matter of iron, chromium, cobalt or the like, sintered ferrite and so on. FIG. 2 is a diagram illustrating an exterior appearance of the magnetic shield 7. Hereinafter, in order to describe the arrangement of constituent elements of the magnetic field measurement apparatus 9, the space in which these constituent elements are arranged is expressed as an xyz coordinate space of right-hand in the drawings. Among the coordinate symbols indicated in the drawings, a symbol formed of a white circle with a black circle inside thereof represents an arrow coming from the depth side to the front side of the paper; a symbol formed of a white circle with two lines intersecting each other inside thereof represents an arrow going from the front side to the depth side of the paper. In the coordinate space, a direction along an x-axis is called an x-axis direction. In addition, of the x-axis direction, a direction along which an x component increases is called a +x direction, whereas a direction along which an x component decreases is called a −x direction. Likewise, as for y and z components, a y-axis direction, a +y direction, a −y direction, a z-axis direction, a +z direction, and a −z direction are defined respectively.

Note that, in the following explanation, when an expression such that a certain direction is arranged along a certain axis is described, the expression includes a case where "the certain direction" is exactly parallel to "the certain axis"; however, the expression is not limited to this case, and includes a case such that a certain direction and a certain axis can be considered to be parallel to each other as long as the same effect can be obtained as in the case where both are exactly parallel to each other. The case in which a certain direction and a certain axis can be considered to be parallel to each other is, for example, a case where an angle formed by the two is within a range of ±2 degrees.

As shown in FIG. 2, the axis connecting the openings at both ends of the magnetic shield 7 is arranged along the y-axis. The gas cell 2 is disposed in the hollow area of the magnetic shield 7.

The magnetic field measurement apparatus 9 has a feature in which the vibration direction of an electric field of linearly polarized light included in the irradiation light which has been converted by the converter 12 is so configured as to coincide with the axis direction of the magnetic shield 7.

1-2. Operation

Figure 3A:
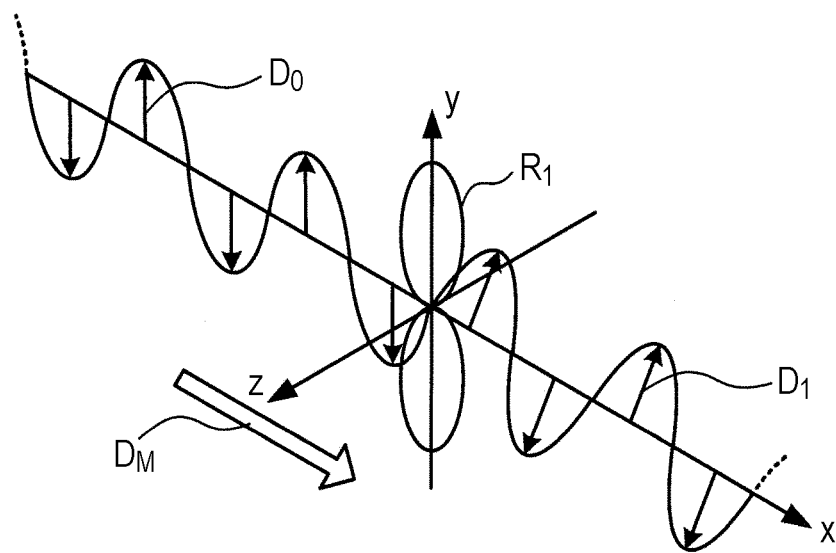
FIGS. 3A and 3B are diagrams for explaining a principle of magnetic field measurement by a one-beam type measurement apparatus.
Figure 3B:
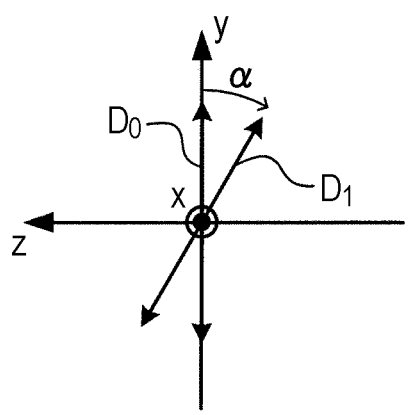

FIGS. 3A and 3B are diagrams for explaining a principle of a magnetic field measurement by what is known as a one-beam type measurement apparatus. In this one-beam type measurement apparatus, when linearly polarized light is irradiated onto gaseous atoms sealed in the gas cell, the gaseous atoms are optically pumped and the probability distribution of magnetic moment generated when the energy changes is caused to vary from a spherical origin-symmetry distribution. For example, in the case of an energy transition of hyperfine structure level where F→F'=F−1, the probability distribution of magnetic moment of the gaseous atoms takes a form corresponding to a region $R_1$ that stretches along a vibration direction of the linearly polarized light. This probability distribution is called "alignment". That is to say, as shown in FIG. 3A, if linearly polarized light whose electric field vibration direction is arranged along an arrow $D_0$ direction that is parallel to the +y direction is irradiated toward the +x direction, for example, alignment that is distributed in the region $R_1$ along the y-axis direction is generated in the gaseous atoms through which the linearly polarized light passes. When the linearly polarized light passes through the gaseous atoms, its polarization plane is rotated due to linear dichroism. FIG. 3B illustrates a rotational angle α of the polarization plane when the vibration direction of an electric field of the linearly polarized light is viewed while facing the −x direction. Because the rotational angle α correlates with the strength of a magnetic filed in the +x direction, the strength of the magnetic field in the x-axis direction inside the gas cell 2 is determined by measuring the rotational angle α. Note that in a one-beam type measurement apparatus, a direction $D_M$ of a magnetic field to be measured is a direction toward which light is irradiated (+x direction in FIG. 3).

Figure 4A:
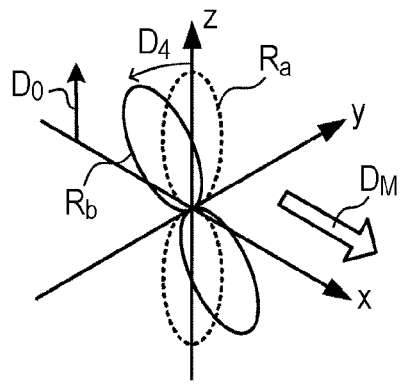
FIGS. 4A through 4C are diagrams for explaining magnetic field measurement by a measurement apparatus without having the features that are included in the magnetic field measurement apparatus according to the first embodiment.
Figure 4B:
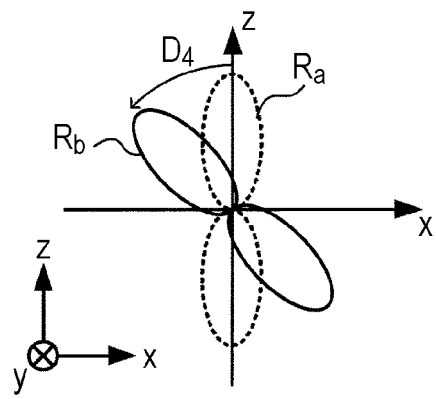
Figure 4C:
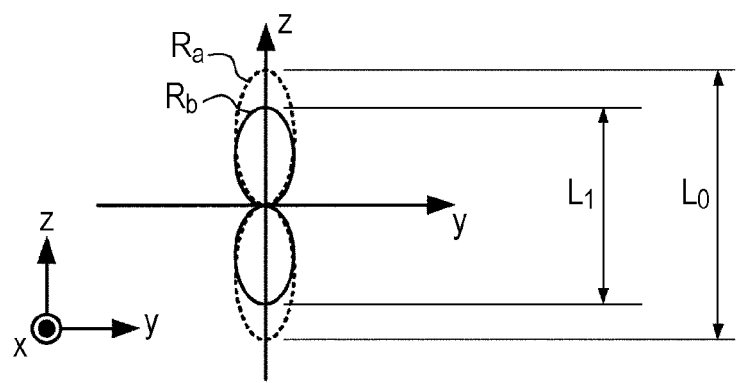

Here, in order to explain the above-mentioned features of the magnetic field measurement apparatus 9 according to the invention, operations of a measurement apparatus that does not have these features will be described first. FIGS. 4A through 4C are diagrams for explaining magnetic field measurement by a measurement apparatus without having the features that are included in the magnetic field measurement apparatus 9. This measurement apparatus is configured by the same constituents as the magnetic field measurement apparatus 9, but the vibration direction of an electric field of linearly polarized light which is included in irradiation light is not so configured as to coincide with the axis direction of the magnetic shield. For example, in this measurement apparatus, the axis of the magnetic shield is arranged along the y-axis direction shown in FIGS. 4A through 4C, and irradiation light having a linearly polarized light component is irradiated toward the +x direction since the direction $D_M$ of the magnetic field to be measured is set in the +x direction. However, the vibration direction of the electric field of the irradiated linearly polarized light does not coincide with the axis direction of the magnetic shield (y-axis direction). Specifically, the vibration direction mentioned above is in parallel with the z-axis direction. Accordingly, in the gaseous atoms sealed in the gas cell, alignment is generated in a region $R_a$ indicated in a broken line in FIGS. 4A through 4C. This alignment takes a form of approximately rotational symmetry central to the z-axis, and stretches along the z-axis direction.

Since this measurement apparatus includes the magnetic shield with the axis that is arranged along the y-axis direction, disturbance in magnetic fields along the x-axis direction, the z-axis direction and a resultant direction of the x-axis and y-axis directions can be suppressed at a high probability. However, a magnetic field disturbance along the y-axis direction is likely to exert an influence on the hollow area of the magnetic shield. The alignment generated in the gaseous atoms sealed in the gas cell as described above rotates central to an axis parallel to the y-axis upon receiving a magnetic field disturbance along the y-axis direction. That is, the alignment rotates so as to have a posture corresponding to a region $R_b$ indicated in a solid line in FIG. 4A. FIG. 4B shows the alignment that is viewed while facing the +y direction. As described thus far, the alignment that has originally been generated in the region $R_a$ is made to rotate in an arrow $D_4$ direction being influenced by the magnetic field in the y-axis direction that has not been suppressed sufficiently by the magnetic shield, and consequently has a posture corresponding to the region $R_b$.

FIG. 4C shows the alignment that is viewed from the side where the irradiation light having passed through the gaseous atoms is measured, i.e., the alignment is viewed from the +x direction side while facing the −x direction side on which the gaseous atoms exist. The region $R_b$, which shows a form of the alignment after having been rotated due to the magnetic field disturbance, is shorter in length when viewed facing the −x direction than the region $R_a$, which shows a form of the alignment before the rotation. In other words, the length of the region Ra in the z-axis direction is $L_0$, whereas the length of the region $R_b$ in the z-axis direction is $L_1$, which is shorter than $L_0$. Accordingly, in this measurement apparatus, the size of the alignment when viewed from the side where the irradiation light having passed through the gaseous atoms is measured becomes smaller being influenced by the magnetic field disturbance. As a result, the sensitivity of this measurement apparatus is lowered due to the influence of the magnetic field disturbance.

Figure 5A:
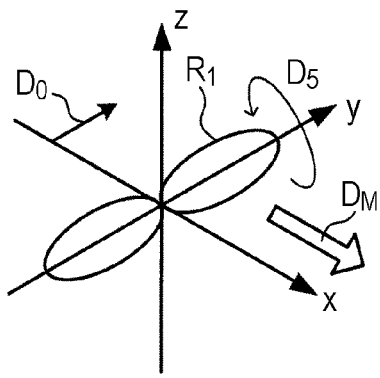
FIGS. 5A through 5C are diagrams for explaining magnetic field measurement by the magnetic field measurement apparatus according to the first embodiment.
Figure 5B:
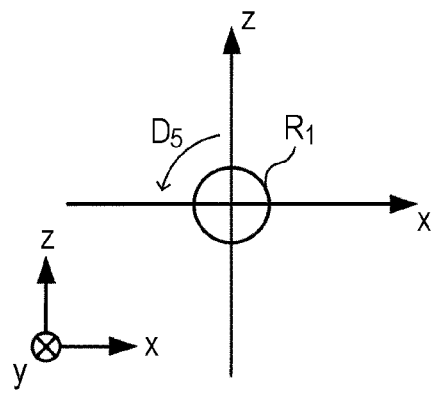
Figure 5C:
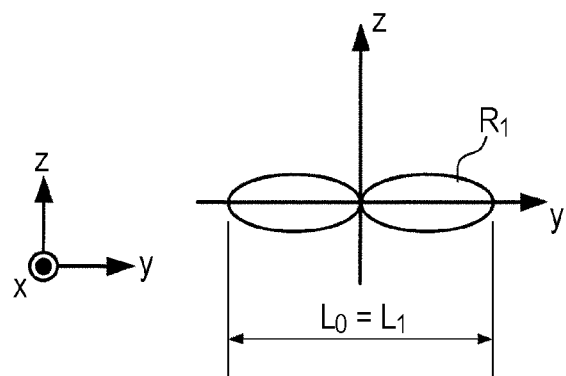

Meanwhile, FIGS. 5A through 5C are diagrams for explaining magnetic field measurement by the magnetic field measurement apparatus 9 according to the invention. The axis of the magnetic shield 7 in the magnetic field measurement apparatus 9 is arranged along the y-axis direction shown in FIGS. 5A through 5C, and irradiation light including a linearly polarized light component is irradiated toward the +x direction because the direction $D_M$ of the magnetic field to be measured is set in the +x direction. The vibration direction of an electric field of the irradiated linearly polarized light is made to coincide with the axis direction of the magnetic shield (y-axis direction). Accordingly, alignment is generated in the region $R_1$ as shown in FIG. 5A in the gaseous atoms in the gas cell. This alignment takes a form of approximately rotational symmetry central to the y-axis and stretches in the y-axis direction. Since the alignment makes Larmor rotation central to the x-axis, the rotational symmetry deviates from the y-axis. However, because its deviation displacement is much smaller compared to size of the magnetic field disturbance, this alignment can be considered to have a form of approximately rotational symmetry central to the y-axis.

Since the magnetic field measurement apparatus 9 has the magnetic shield 7 whose axis is arranged along the y-axis direction, a magnetic field disturbance along the y-axis direction is more likely to influence the hollow area than those along the directions of x-axis, z-axis and the like. The aforementioned alignment generated in the gaseous atoms in the gas cell 2 rotates about the y-axis direction as an axis upon receiving a magnetic field disturbance along the y-axis direction. In other words, the alignment rotates in an arrow $D_5$ direction as shown in FIG. 5A. FIG. 5B shows the alignment that is viewed while facing the +y direction. As described above, the alignment generated in the region $R_1$ takes a form of approximately rotational symmetry central to the y-axis and stretches in the y-axis direction. Therefore, even if the alignment is rotated in the arrow $D_5$ direction following a trajectory of an arc central to the y-axis, its form hardly varies. Accordingly, as shown in FIG. 5C, the length in form of the alignment that is viewed while facing the −x direction hardly differs between before and after the rotation due to the magnetic field disturbance. In other words, the length $L_0$ of the alignment before the rotation is approximately equal to the length $L_1$ of the alignment after the rotation. That is to say, sensitivity of the magnetic field measurement apparatus 9 is unlikely to be influenced by a magnetic field disturbance.

2. Second Embodiment 2-1. Configuration

Figure 6:
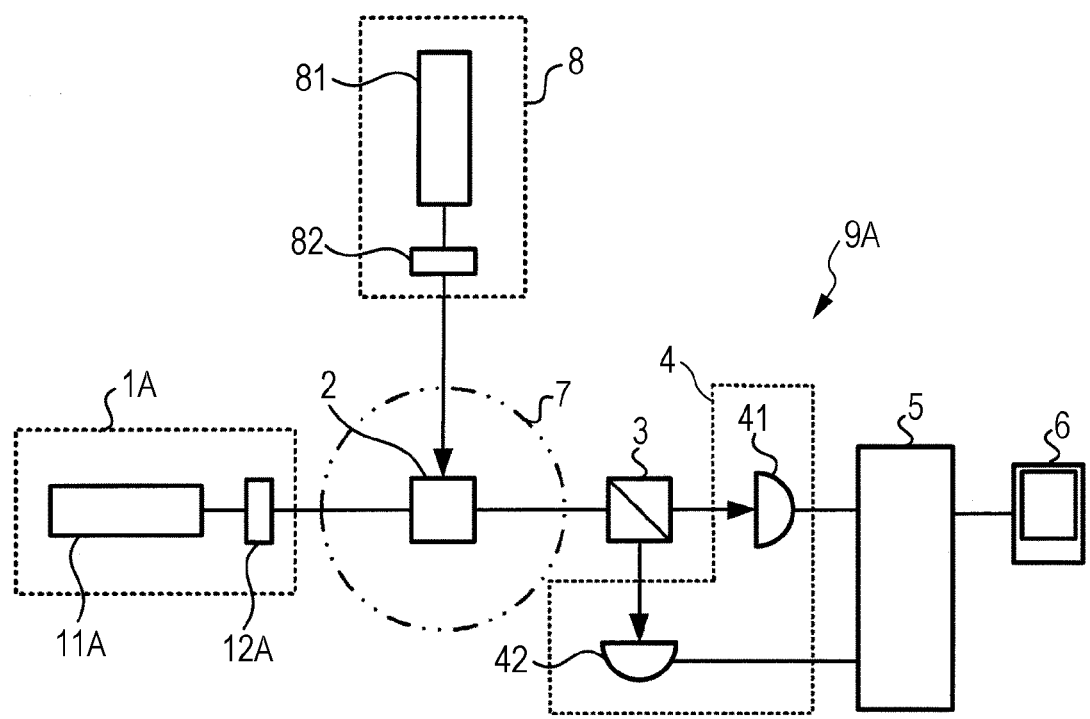
FIG. 6 is a diagram illustrating an overall configuration of a magnetic field measurement apparatus according to a second embodiment of the invention.

FIG. 6 is a diagram illustrating an overall configuration of a magnetic field measurement apparatus 9A according to a second embodiment of the invention. The magnetic field measurement apparatus 9A is what is known as a two-beam type measurement apparatus in which a pump light irradiation device and a probe light irradiation device are separately provided. The magnetic field measurement apparatus 9A is different from the magnetic field measurement apparatus 9 of the first embodiment in that the apparatus 9A has a probe light irradiation portion 1A in place of the irradiation portion 1 and a pump light irradiation portion 8; other constituents of the magnetic field measurement apparatus 9A are the same as those of the magnetic field measurement apparatus 9. It is to be noted that the magnetic shield 7 in FIG. 6 is not placed at the actual position with respect to the probe light irradiation portion 1A, the gas cell 2, the pump light irradiation portion 8 and the polarization separation unit 3.

The description of the magnetic field measurement apparatus 9A is given below focusing mainly on the features that are different from those in the magnetic field measurement apparatus 9.

The probe light irradiation portion 1A includes a light source 11A and a converter 12A. The light source 11A may be the light source 11, and the converter 12A may be the converter 12. However, it is preferable that a wavelength of probe light irradiated by the probe light irradiation portion 1A be set separated from the resonant frequency of gaseous atoms sealed in the gas cell 2 so as to prevent unnecessary pumping. Further, as for light components included in probe light, the larger the rate of a linearly polarized component within the whole components is, the better it is to the component included in probe light. Note that, as long as probe light includes a linearly polarized light component, it may include other polarized light components. Probe light generated by the light source 11A and converted by the converter 12A is irradiated to the gas cell 2 while being guided by, for example, an optical fiber or the like. Probe light may be directly irradiated to the gas cell 2 without using an optical fiber or the like by disposing the probe light irradiation portion 1A inside the magnetic shield 7, for example.

The pump light irradiation portion 8 includes a light source 81 and a converter 82. The light source 81 is a laser generation device that generates a laser of a frequency that corresponds to a hyperfine structure level transition of the atom sealed in the gas cell 2. In other word, the light source 81 generates a laser that synchronizes with a wavelength that can excite gaseous atoms sealed in the gas cell 2. The converter 82 includes a circular polarization filter and the like, and converts the laser having been generated by the light source 81 to pump light having a circularly polarized light component. Pump light that has been generated by the light source 81 and converted by the converter 82 is irradiated to the gas cell 2 while being guided by, for example, an optical fiber or the like. Pump light is irradiated so that it intersects with probe light in the gas cell 2. Pump light may be directly irradiated to the gas cell 2 without using an optical fiber or the like by disposing the pump light irradiation portion 8 inside the gas shield 7, for example.

The magnetic field measurement apparatus 9A is characterized in that the incident direction of pump light having been converted to by the converter 82 is configured so as to coincide with the axis of the magnetic shield 7.

2-2. Operation

Figure 7:
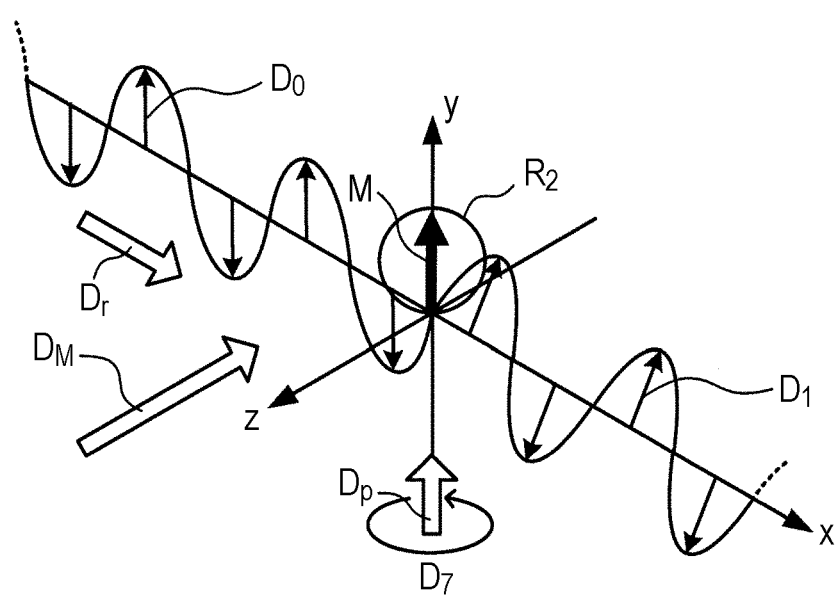
FIG. 7 is a diagram for explaining a principle of magnetic field measurement by a two-beam type measurement apparatus.

FIG. 7 is a diagram for explaining the principle of magnetic field measurement by what is known as a two-beam type measurement apparatus. In the two-beam type measurement apparatus, when pump light is irradiated onto gaseous atoms sealed in the gas cell, the gaseous atoms are optically pumped and the probability distribution of magnetic moment generated when the energy changes takes a form corresponding to a region $R_2$ that stretches along the incident direction of the pump light. This probability distribution is called "orientation". A vector that indicates the direction of magnetization generated by the formation of orientation (hereinafter, referred to as a magnetization vector M) points to the direction of orientation. In this case, the irradiation direction of the pump light is the direction of the magnetization vector M.

As shown in FIG. 7, for example, if pump light having a circularly polarized light component in an arrow $D_7$ direction is irradiated toward an arrow $D_p$ direction (+y direction), orientation that is distributed in the region $R_2$ stretching in the +y direction is formed in the gaseous atoms through which the pump light passes, and the magnetization vector M in the +y direction is generated. Then, if probe light having a linearly polarized light component whose electric field vibration direction is arranged along the arrow $D_0$ direction is irradiated toward an arrow $D_r$ direction (+x direction), the orientation performs Larmor rotation central to the arrow $D_M$ direction (−z direction) perpendicular to both the arrow $D_p$ direction (+y direction) and the arrow $D_r$ direction (+x direction). This causes the magnetization vector M to rotate central to the z-axis; at this time the following two phenomena take place.

Phenomenon A: a phenomenon in which the orientation (magnetization vector M) is forced to return to the direction of pump light.

Phenomenon B: a phenomenon in which the orientation experiences relaxation so as to have a spherical origin-symmetry form, which is a form of orientation before optical pumping.

Figure 8A:
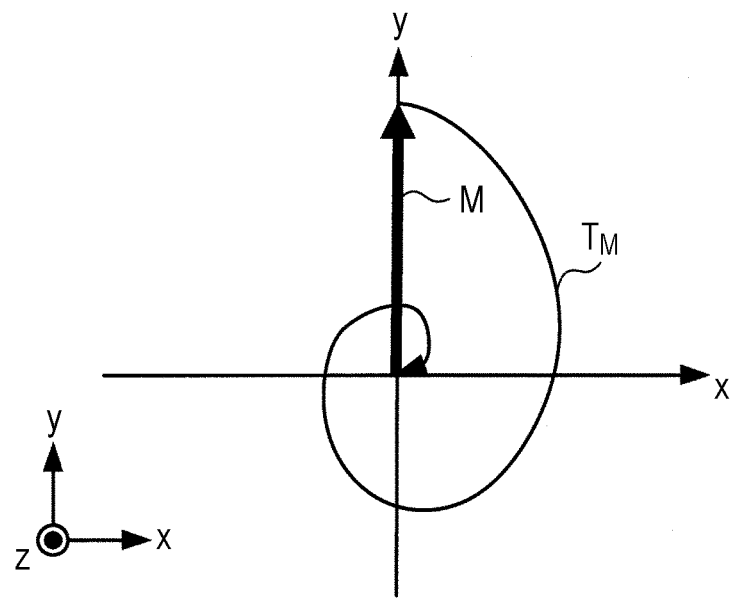
FIGS. 8A and 8B are diagrams for explaining a trajectory of a magnetization vector according to the second embodiment.
Figure 8B:
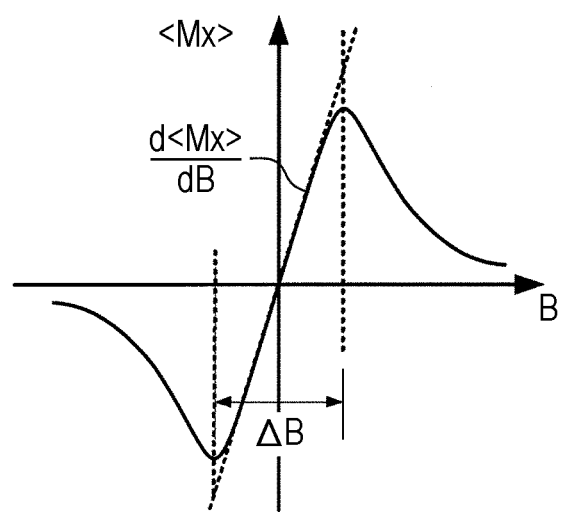

As a result, the magnetization vector M forms a trajectory in a spiral shape on an xy plane. FIGS. 8A and 8B are diagrams for explaining a trajectory of the magnetization vector M. For example, in the configuration shown in FIG. 7, the magnetization vector M forms a trajectory $T_M$ as shown in FIG. 8A on the xy plane viewed while facing the arrow $D_M$ direction (−z direction). Further, the polarization plane of probe light described above passes through the orientation and rotates due to the Faraday effect. Accordingly, magnetic flux density in the arrow $D_M$ direction (−z direction) inside of the gas cell 2 is determined by measuring a rotational angle of the polarization plane mentioned above.

For example, in the case where the magnetization vector M forms the trajectory $T_M$ as shown in FIG. 8A, an expected value of magnetization $<M_X>$ in the +x direction is obtained as a specified value. In the case where the horizontal axis represents magnetic flux density B and the vertical axis represents the expected value of magnetization $<M_X>$ respectively in a graph, an output waveform as shown in FIG. 8B is obtained. The magnetic flux density B to be measured can be determined by reading the output of a linearly changing portion in the waveform in the vicinity of the origin (a range of $\Delta B$ in the drawing).

A relational expression between the expected value of magnetization $<M_X>$ and the magnetic flux density B is as follows.

$$\frac{d<M_x>}{dB}\bigg|_{B=0} = -C\frac{\gamma}{\Gamma_g} \approx -C\gamma T_2$$

Here, $\Gamma_g$ is a relaxation rate and is given by the inverse of a relaxation time T. The relaxation time T is expressed in a formula of $1/T = 1/T_1 + 1/T_2$, where $T_1$ is a longitudinal relaxation time and $T_2$ is a traverse relaxation time. Further, in the case where $\omega_L$ is a Larmor angular frequency [rad/s], $\gamma$ is a gyromagnetic ratio [rad/sT], and B is magnetic flux density [T], a formula of $\omega_L = \gamma B$ holds. Since the magnetization vector M is a total of magnetic moment per volume unit, a proportional constant C is considered to be a parameter proportional to atomic density n.

Figure 9A:
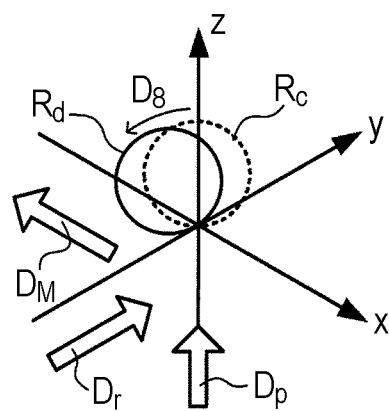
FIGS. 9A and 9B are diagrams for explaining magnetic field measurement by a measurement apparatus without having the features that are included in the magnetic field measurement apparatus according to the second embodiment.
Figure 9B:
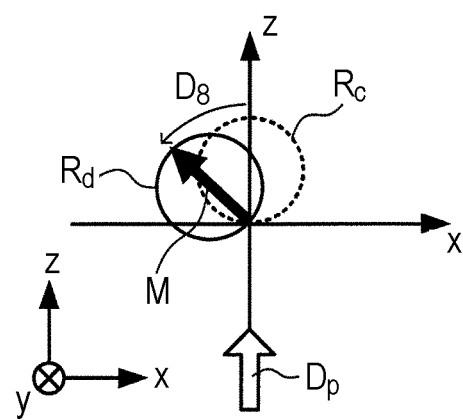

Here, in order to explain the aforementioned features of the magnetic field measurement apparatus 9A according to the invention, operations of a measurement apparatus without having the features mentioned above are described first. FIGS. 9A and 9B are diagrams for explaining magnetic field measurement by the measurement apparatus without having the features that are included in the magnetic field measurement apparatus 9A. This measurement apparatus includes the same constituents as the magnetic field measurement apparatus 9A, but the incident direction $D_p$ of pump light is configured so as not to coincide with the axis direction of the magnetic shield 7. For example, in this measurement apparatus, the axis of the magnetic shield is arranged along the y-axis direction shown in FIGS. 9A and 9B, and pump light having a circularly polarized light component is irradiated toward the +z direction. That is, the incident direction $D_p$ (+z direction) of pump light for irradiation is configured so as not to coincide with the axis direction of the magnetic shield (y-axis direction). Therefore, orientation is generated in a region $R_c$ indicated in a broken line in FIG. 9A in the gaseous atoms sealed in the gas cell. This orientation has a form of approximately rotational symmetry central to the z-axis, and stretches along the z-axis direction.

Since this measurement apparatus includes the magnetic shield whose axis is arranged along the y-axis direction, a magnetic field disturbance along the x-axis direction, the z-axis direction and a resultant direction of the x-axis and y-axis directions can be suppressed at a high probability. However, a magnetic field disturbance along the y-axis direction is likely to exert an influence on the hollow area of the magnetic shield. The orientation generated in the gaseous atoms sealed in the gas cell as described above rotates central to an axis parallel to the y-axis upon receiving the magnetic field disturbance along the y-axis direction. That is, the orientation rotates so as to have a posture corresponding to a region $R_d$ indicated in a solid line in FIG. 9A. FIG. 9B shows the orientation that is viewed while facing the +y direction. As described thus far, the orientation that has originally been generated in the region $R_c$ indicated in a broken line is made to rotate in an arrow $D_8$ direction influenced by the magnetic field in the y-axis direction that has not been suppressed sufficiently by the magnetic shield, and consequently has a posture corresponding to the region $R_d$.

In the example shown in FIGS. 9A and 9B, in order to measure the magnetic flux density in the arrow $D_M$ direction (−x direction), probe light is irradiated toward the arrow $D_r$ direction (+y direction). In other words, probe light is irradiated from the −y direction of the gas cell, and an rotational angle of the polarization plane of the probe light having passed through the gas cell to the +y direction thereof is measured by a measurement unit (polarization separation unit 3, light receiving portion 4, signal processing circuit 5). As illustrated in FIG. 9B, since the orientation, when viewed along the +y direction, rotates from the region $R_c$ to the region $R_d$ upon receiving the magnetic field disturbance along the y-axis direction, the magnetization vector M also rotates in the −x direction. Accordingly, the magnetization vector M forms a different trajectory from that in FIG. 8A described before, and the expected value of magnetization becomes a different one, whereby a waveform becomes an output waveform influenced by the magnetic field disturbance. Therefore, the measurement in this case is likely to be influenced by a disturbance in magnetic field.

Figure 10A:
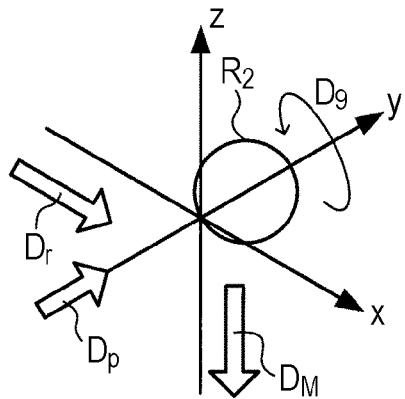
FIGS. 10A through 10C are diagrams for explaining magnetic field measurement by the magnetic field measurement apparatus according to the second embodiment.
Figure 10B:
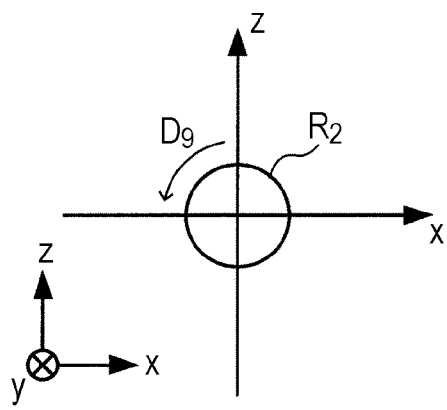
Figure 10C:
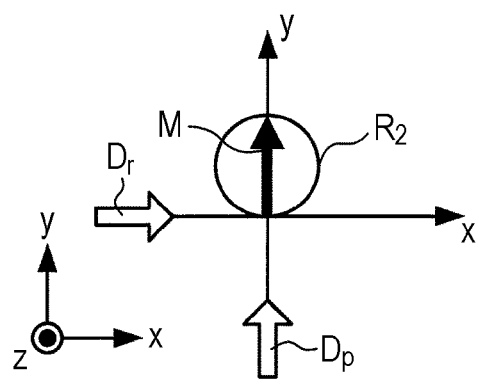

Meanwhile, FIGS. 10A through 10C are diagrams for explaining magnetic field measurement by the magnetic field measurement apparatus 9A according to the invention. The axis of the magnetic shield 7 in the magnetic field measurement apparatus 9A is arranged along the y-axis direction shown in FIG. 10A through 10C, and pump light including a circularly polarized light component is irradiated toward the +y direction. That is to say, the incident direction $D_p$ (+y direction) of the irradiated pump light coincides with the axis direction of the magnetic shield (y-axis direction). Accordingly, orientation is generated in the region $R_2$ as shown in FIG. 10A in the gaseous atoms in the gas cell. This orientation takes a form of approximately rotational symmetry central to the y-axis and stretches in the y-axis direction. In this case, probe light is irradiated toward the arrow $D_r$ direction (+x direction) so as to measure the magnetic field in the arrow $D_M$ direction (−z direction).

Since the magnetic field measurement apparatus 9A has the magnetic shield 7 whose axis is arranged along the y-axis direction, a magnetic field disturbance along the y-axis direction is likely to influence the hollow area. The aforementioned orientation generated in the gaseous atoms in the gas cell 2 rotates about the y-axis direction as an axis upon receiving the magnetic field disturbance along the y-axis direction. In other words, the orientation rotates in an arrow $D_9$ direction as shown in FIG. 10A. FIG. 10B shows the orientation that is viewed while facing the +y direction. As described above, the orientation generated in the region $R_2$ takes a form of approximately rotational symmetry central to the y-axis and stretches in the y-axis direction. Therefore, even if the orientation is rotated in the arrow $D_9$ direction following a trajectory of an arc central to the y-axis, its form hardly varies. Accordingly, as shown in FIG. 10C, on the xy plane viewed while facing the arrow $D_M$ direction (−z direction), the direction of the magnetization vector M generated by the formation of orientation hardly differs between before and after the orientation rotates due to the magnetic field disturbance. Therefore, in this case, when probe light having a linearly polarized light component is irradiated toward the arrow $D_r$ direction (+x direction), the magnetization vector M forms a trajectory as illustrated in FIG. 8A, then the magnetic flux density is determined. That is to say, sensitivity of the magnetic field measurement apparatus 9A is unlikely to be influenced by the magnetic field disturbance.

The entire disclosure of Japanese Patent application No. 2011-229036, filed Oct. 18, 2011 is expressly incorporated by reference herein.

What is claimed is:

1. A magnetic field measurement apparatus comprising:
  a magnetic shield that is formed in an elongated hollow shape having openings at both sides thereof;
  a gas cell in which alkali metal gaseous atoms are sealed and that is disposed in a hollow area of the magnetic shield;
  an irradiation unit that irradiates irradiation light including linearly polarized light onto the alkali metal gaseous atoms sealed in the gas cell along a direction perpendicular to the axis of the magnetic shield, the alkali metal gaseous atoms being optically pumped to form a gaseous atom magnetic moment probability distribution that stretches along a magnetic field disturbance direction which is an axis direction of the magnetic shield, the lineally polarized light being adjusted so as to be a state in which a vibration direction of an electric field is parallel to the magnetic field disturbance direction; and
  a measurement unit that measures a rotational angle of a polarization plane of the irradiation light which is irradiated by the irradiation unit and passes through the alkali metal gaseous atoms.

2. The magnetic field measurement apparatus according to claim 1,
wherein the irradiation unit guides the irradiation light to the gas cell with an optical fiber.

3. The magnetic field measurement apparatus according to claim 1,
wherein the direction perpendicular to the axis of the magnetic shield is parallel to a direction of a magnetic field to be measured.

4. The magnetic field measurement apparatus according to claim 3,
wherein the irradiation unit guides the irradiation light to the gas cell with an optical fiber.

5. A magnetic field measurement apparatus comprising:
a magnetic shield that is formed in an elongated hollow shape having openings at both sides thereof;
a gas cell in which alkali metal gaseous atoms are sealed and that is disposed in a hollow area of the magnetic shield;
a pump light irradiation unit that irradiates pump light including a circularly polarized light component onto the alkali metal gaseous atoms sealed in the gas cell along a direction parallel to a magnetic field disturbance direction which is an axis of the magnetic shield, the alkali metal gaseous atoms being optically pumped to form a gaseous atom magnetic moment probability distribution of a magnetic field that stretches along the magnetic field disturbance direction;
a probe light irradiation unit that irradiates probe light including linearly polarized light onto the alkali metal gaseous atoms sealed in the gas cell along a direction perpendicular to the axis of the magnetic shield; and
a measurement unit that measures a rotational angle of a polarization plane of the probe light which is irradiated by the probe light irradiation unit and passes through the alkali metal gaseous atoms.

6. The magnetic field measurement apparatus according to claim 5,
wherein the pump light irradiation unit guides the pump light to the gas cell with an optical fiber and the probe light irradiation unit guides the probe light to the gas cell with an optical fiber.

* * * * *